(12) United States Patent
Tagami

(10) Patent No.: US 6,176,179 B1
(45) Date of Patent: Jan. 23, 2001

(54) SCREEN PRINTER AND A SCREEN PRINTING METHOD

(75) Inventor: Yoshiaki Tagami, Chiba (JP)

(73) Assignee: Micro-Tec Company, Ltd., Chiba (JP)

( * ) Notice: Under 35 U.S.C. 154(b), the term of this patent shall be extended for 0 days.

(21) Appl. No.: 09/318,769

(22) Filed: May 26, 1999

(30) Foreign Application Priority Data

Jun. 4, 1998 (JP) .................................................. 10-172206

(51) Int. Cl.$^7$ ....................................................... B41M 1/12

(52) U.S. Cl. ............................................ 101/129; 101/123

(58) Field of Search ..................................... 101/114, 123, 101/124, 126, 129

(56) References Cited

U.S. PATENT DOCUMENTS 5,483,884  1/1996  Vellanki ............................... 101/129
5,893,325  4/1999  Sakai ..................................... 101/123

FOREIGN PATENT DOCUMENTS 7185429   12/1993  (JP) .

*Primary Examiner*—Ren Yan

(57) ABSTRACT

The present invention aims to achieve a screen printer which will not result in uneven printing which may occur depending on the printed positions. The moving position of squeegee is detected by the sensors. The pressure control unit adjusts a degree of opening and closing the valve depending on the moving position of squeegee, and adjusts the pressure P generated by the air cylinder. By decreasing the pressure P at center and increasing the pressure P at both edges of a work, the work is printed without any unevenness.

7 Claims, 8 Drawing Sheets

SCREEN PRINTER AND A SCREEN PRINTING METHOD

BACKGROUND OF THE INVENTION

1. Field of the Invention

The present invention relates to a screen printer for screen printing. Particularly, the present invention relates to the screen printer which does not result in uneven printing.

2. Background Art

The drawing of FIG. 7 illustrates a perspective side view of the actual screen printer.

The drawing of FIG. 8 outlines a lateral view of the screen printer.

The drawing of FIG. 9 outlines a plane view of the screen printer.

FIG. 7 illustrates the following elements: a screen printer 101; a base 102 of the screen printer; a movable table 103 attached to allow for a movement; a guide rail 104 for guiding the movement of movable table 103; an operating box 105 of the screen printer; an operating switch 107 attached to the operating box; and a printing unit 109 for printing a work placed on the movable table 103.

FIGS. 8 and 9 illustrate the following elements: a work 110 placed on top of the movable table 103; a screen plate 200; a screen frame 201 of the screen plate 200; a screen 211 affixed to the screen plate 200; a slider 106 holding a squeegee 111 and a scrapper (not illustrated), for sliding in directions indicated by arrows A and D; and frames 108 for sliding the slider 106.

The movable table 103 is situated on the guide rail 104 which is laid to the base 102 so that the movable table 103 can move along the guide rail 104, sliding from side to side. When the movable table 103 moves beneath the printing unit 109, the movable table 103 is stopped by a stopper which is not illustrated, and then the printing unit 109 performs a screen print on the work 110.

Suction holes 190 are installed to the movable table 103. The work 110 is stuck to the movable table 103 by sucking up the air through the suction holes 190 as indicated by the arrows.

The drawing of FIG. 10 illustrates printing states of the printing unit 109.

An ink 51 is applied uniformly on top of the screen 211.

In FIG. 10, state (a) illustrates a state before commencing the printing. There is a distance 95 between the screen 211 and the work 110. In FIG. 10, state (b) illustrates a case of starting the printing by applying a pressure P to the squeegee 111. In FIG. 10, state (c) illustrates a case of printing a pattern 52, pattern 53 and pattern 54 onto the work 110 in accordance to pre-made patterns of the screen 211. In FIG. 10, state (d) illustrates completion of the printing. During the states (b) to (d) of FIG. 10 which illustrate printing in progress, the pressure P applied to the squeegee 111 is constant as illustrated in graph (e) of FIG. 10.

While printing as shown in FIG. 10, there is a case when a height H1 of the pattern 52 and a height H2 of the pattern 54 illustrated in state (d) of FIG. 10 may become different. Although the screen 211 is firmly affixed to the screen frame 201, a tension varies in different places of the screen 211. Therefore, even if a constant pressure P is applied from above to down, the printed heights of the patterns may vary depending on the position printed, or in other words, the heights of printed ink may become different. There is a problem of unevenness in the spread of the ink on the work 110 or a problem of uneven printing.

The drawing of FIG. 11 illustrates a method to resolve the previously described unevenness in the spread of the ink.

When the printing is in progress, a lifting apparatus (screen detaching apparatus) not illustrated is used to lift the screen plate 200 in a direction of arrow X (H10<H20<H30). By lifting the screen plate 200 from a side where the screen printing is finished, the conventional screen printer offsets a change in the tension on different positions of the screen 211. As a result of this, the height H1 of pattern 52 printed at the edge of the work 110 and the height H2 of pattern 54 printed at the center of the work 110 can be made almost equal.

However, by using this method of lifting one side of the screen plate 200 as illustrated in FIG. 11, a pressure is applied to the screen plate 200 more than necessary. Due to this, a position of printing the pattern installed to the screen 211 may be displaced, and a durability of the screen plate 200 may be reduced.

The present invention attempts to solve the problems mentioned above by aiming to achieve a screen printing for even printing to the work 110 without having to use the lifting apparatus.

SUMMARY OF THE INVENTION

According to one aspect of the present invention, a screen printer for screen printing using a squeegee comprises: a position detecting unit for detecting a squeegee moving position during the screen printing; a pressure unit for applying a pressure to the squeegee during the screen printing; and a pressure control unit for controlling the pressure of the pressure unit depending on the squeegee moving position detected by the position detecting unit.

According to another aspect of the present invention, the screen printer includes the pressure control unit which reduces a pressure applied to a center area of squeegee movement to be smaller than a pressure applied to edges of the area of squeegee movement.

According to another aspect of the present invention, the screen printer includes the pressure control unit which changes the pressure smoothly.

According to another aspect of the present invention, the screen printer comprises the position detecting unit which includes a sensor which can change its setting position along a direction of the squeegee movement.

According to another aspect of the present invention, the screen printer comprises the pressure unit which includes an air pump for generating a compressed air; a valve for allowing a passage of the compressed air; and an air cylinder for applying the pressure to the squeegee by inputting the compressed air through the valve. The pressure control unit adjusts a degree of opening and closing of the valve.

According to another aspect of the present invention, the screen printer comprises the pressure unit which includes a motor which generates the pressure.

According to another aspect of the present invention, the screen printer comprises the position detecting unit which includes a sensor which detects a number of motor rotations involved in the squeegee movement.

According to another aspect of the present invention, the screen printer comprises the pressure control unit including a program which calculates the pressure based on the squeegee moving position and one of a screen size, a screen tension, a work size, and a distance between work and screen.

According to another aspect of the present invention, a screen printing method for screen printer using a squeegee, comprises steps of: detecting a squeegee moving position during the screen printing; applying a pressure to the squeegee during the screen printing; and controlling the pressure depending on the squeegee moving position detected.

According to another aspect of the present invention, the screen printing method includes the pressure controlling step which reduces a pressure applied to a center area of squeegee movement to be smaller than a pressure applied to edges of the area of squeegee movement.

According to another aspect of the present invention, the screen printing includes the pressure controlling step which changes the pressure smoothly.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus do not limit the present invention, and wherein.

DETAILED DESCRIPTION OF THE PREFERRED EMBODIMENTS

Figure 1:
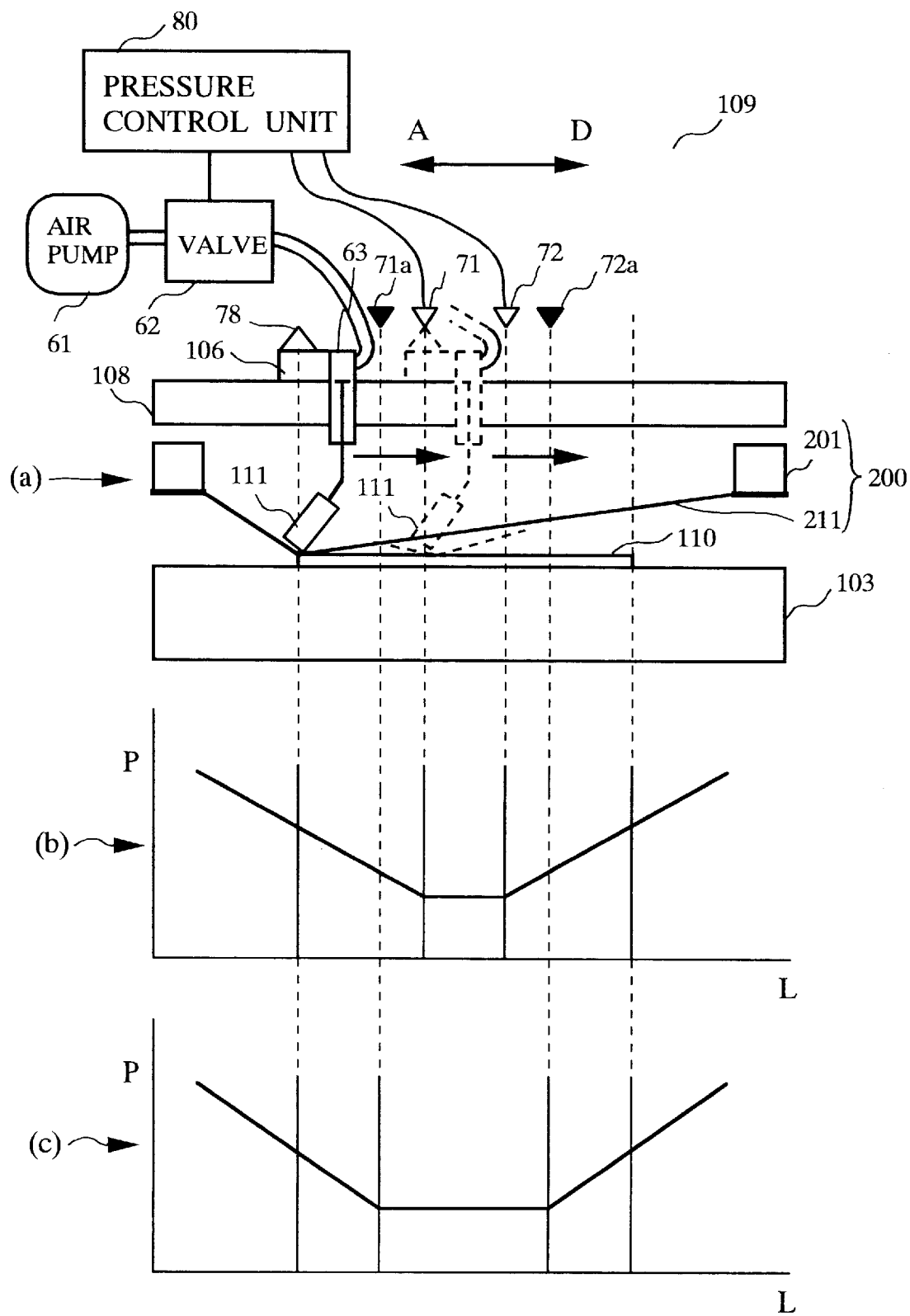
FIG. 1 illustrates a lateral view of the printing unit 109 of the screen printer and graphs showing pressure P.

Reference will now be made in detail to the present preferred embodiments of the invention, examples of which are illustrated in the accompanying drawings, wherein like reference numerals indicate like elements throughout the several views.

Embodiment 1

The drawing of FIG. 1 illustrates a lateral view of the printing unit 109 of the screen printer and graphs showing the pressure P.

A sensor 71 and sensor 72 are attached to the printing unit 109. A detection segment 78 is mounted on the slider 106. Also, an air cylinder 63 is provided to the slider 106. The slider 106 is attached to the frame 108 in such a way that the slider 106 can slide in the directions indicated by the arrows A and D. An air pump 61 forms a compressed air. A valve 62 is a regulator for controlling an amount of passage of the compressed air. The air cylinder 63 receives a supply of the compressed air via the valve 62, and creates a pressure (a printing pressure) P to be applied to the squeegee 111. The sensors 71 and 72 detects passing of the detection segment 78. If passing of the detection segment 78 is detected by the sensors 71 and 72, its detected result is transferred to a pressure control unit 80. The pressure control unit 80 will know a position where the squeegee 111 has moved to based on the signals from the sensors 71 and 72. The pressure control unit 80 controls a degree of opening and closing the valve 62 depending on the moving position of the squeegee 111. The air pump 61, the valve 62, and the air cylinder 63 altogether forms a pressure unit for applying the pressure P. Accordingly, the pressure control unit 80 controls the pressure unit.

A control operation of the pressure control unit 80 is as illustrated in graph (b) in FIG. 1. The pressure P is gradually reduced until the detection segment 78 passes by the sensor 71. The pressure P is kept constant when the detection segment 78 is in between the sensor 71 and the sensor 72. If the detection segment 78 passes by the sensor 72, the pressure P is gradually increased.

By controlling the pressure P as described above, when printing, the pressure P is reduced at a center of the work 110, and the pressure P is increased at both edges of the work 110.

The graph (b) of FIG. 1 is corresponding to a fact that a tension of the screen 211 is strong at its surrounding area and weak at a central area. A height of the pattern at the edges printed by intensifying the pressure P where the tension of the screen 211 is strong and a height of the pattern at the center printed by reducing the pressure P where the tension of the screen 211 is weak will become the same, or in other words, the ink thickness becomes constant throughout. Accordingly, the height of the ink becomes even and this enables to get lid of the unevenness in printing.

The sensors 71 and 72 are attachable to the frame 108 along any position of the directions of arrows A and D. That is, setting positions of the sensors 71 and 72 can flexibly be changed.

Graph (c) of FIG. 1 illustrates the sensor 71 set at a position 71a and the sensor 72 set at a position 72a.

By increasing a space between the two sensors, apparently, an area for applying the constant pressure P widens.

Figure 2:
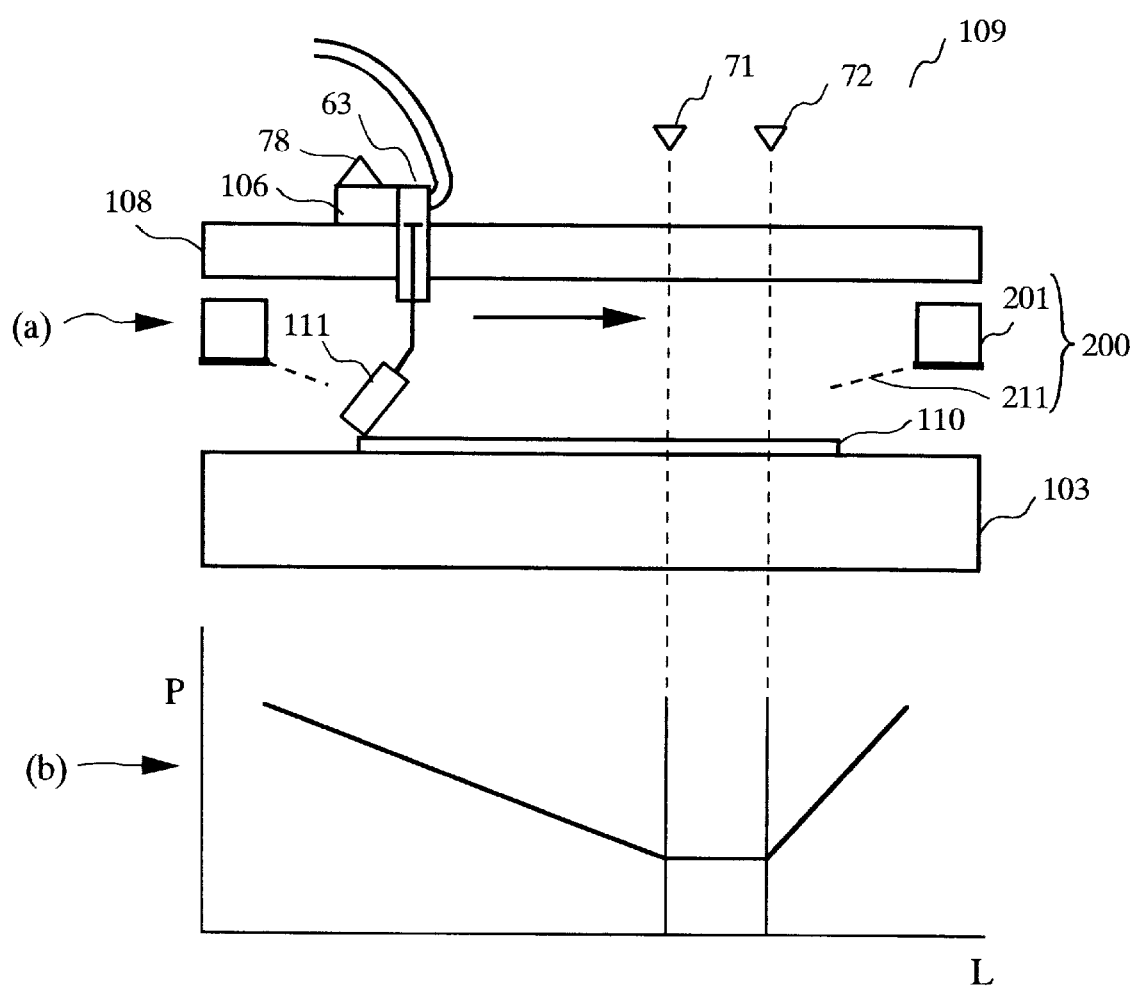
FIG. 2 illustrates a case of changing positions of sensors 71 and 72 of the present invention.

The drawing of FIG. 2 illustrates another example of the setting positions of the sensors 71 and 72.

In FIG. 1, the sensors 71 and 72 are placed on a left-hand side and right-hand side of the center of the work 110, respectively. Or in other words, the sensors 71 and 72 are placed at symmetric positions with respect to the center. However, the sensors can be placed at another position as illustrated in FIG. 2. The case of FIG. 2 illustrates that the sensors 71 and 72 are both placed on the right-hand side of the center. Although not illustrated in the drawing, the sensors 71 and 72 can also be placed on the left-hand side of the center.

Figure 3:
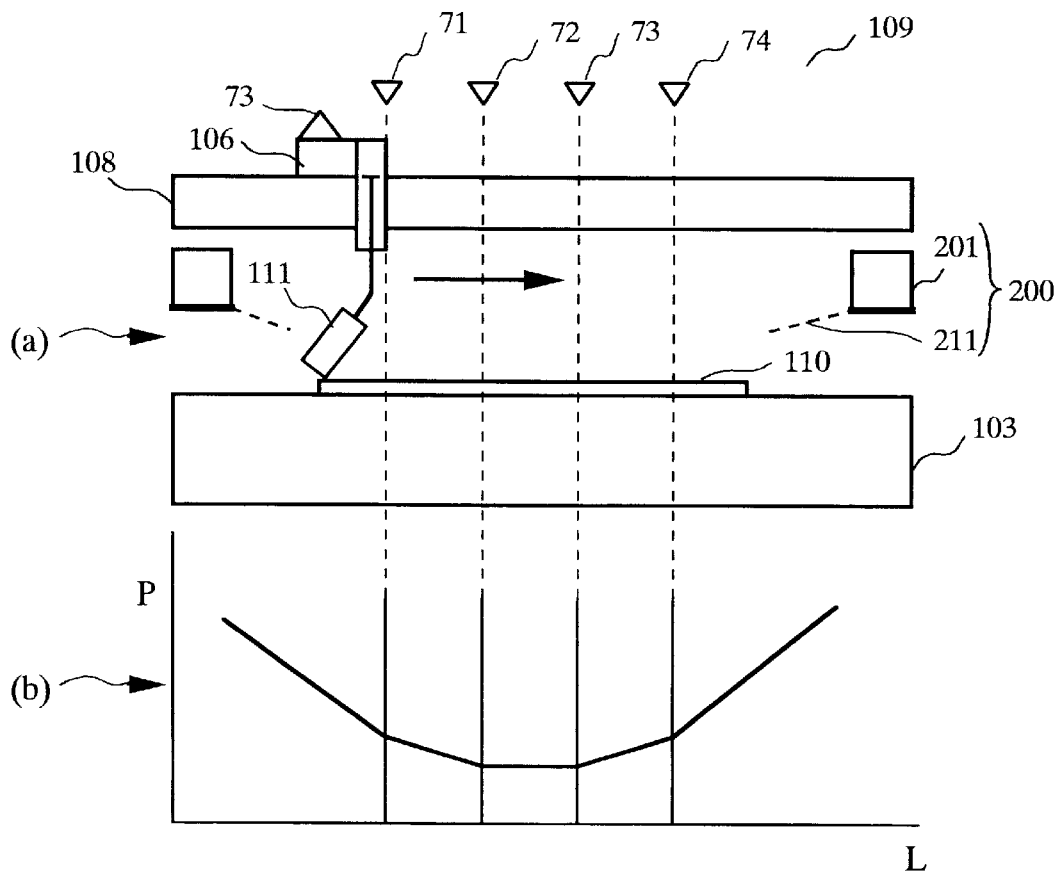
FIG. 3 illustrates a case of increasing a number of the sensors of the present invention.

The drawing of FIG. 3 illustrates a case of installing 4 sensors including the sensors 71 to 74.

By installing the 4 sensors, a finer pressure adjustment is achieved as illustrated in graph (b) of FIG. 3. Although not illustrated in the drawings, more than 4 sensors can be installed. Or, again not illustrated in the drawings but a single sensor or 3 sensors can be installed.

Figure 4:
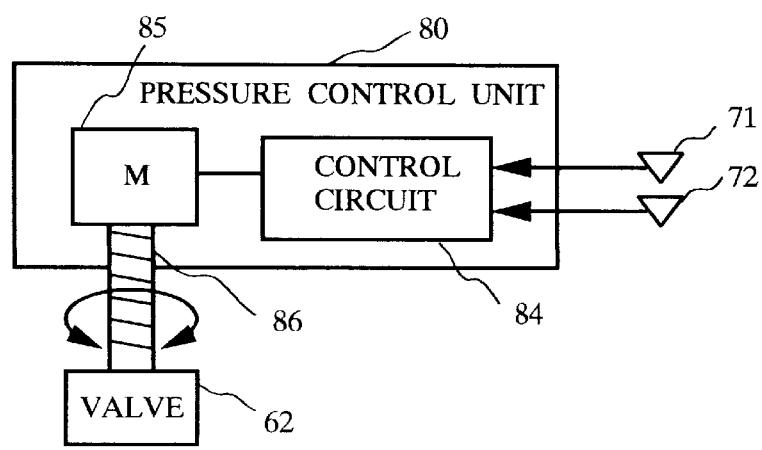
FIG. 4 illustrates one example of pressure control unit 80 of the present invention.

The drawing of FIG. 4 illustrates an example of the pressure control unit 80.

The pressure control unit 80 comprises a control circuit 84, a motor 85, and a rotation axis 86. The control circuit 84 inputs a value of an air pressure gauge which is not illustrated, and controls a rotation of the motor 85 so that a compressed air pressure would be an ideal one. Also, the control circuit 84 receives signals from the sensors 71 and 72, and controls the rotation of motor 85. Examples of the motor 85 are a servo motor or stepper motor. Example of the valve 62 is a regulator for adjusting the compressed air pressure by rotating a screw. In this example, the rotation axis 86 of the motor 85 is used as the screw. That is, the rotation axis 86 adjusts the degree of opening and closing the valve 62 by the rotation of motor 85. Accordingly, the valve 62 is physically opened or closed.

Figure 5:
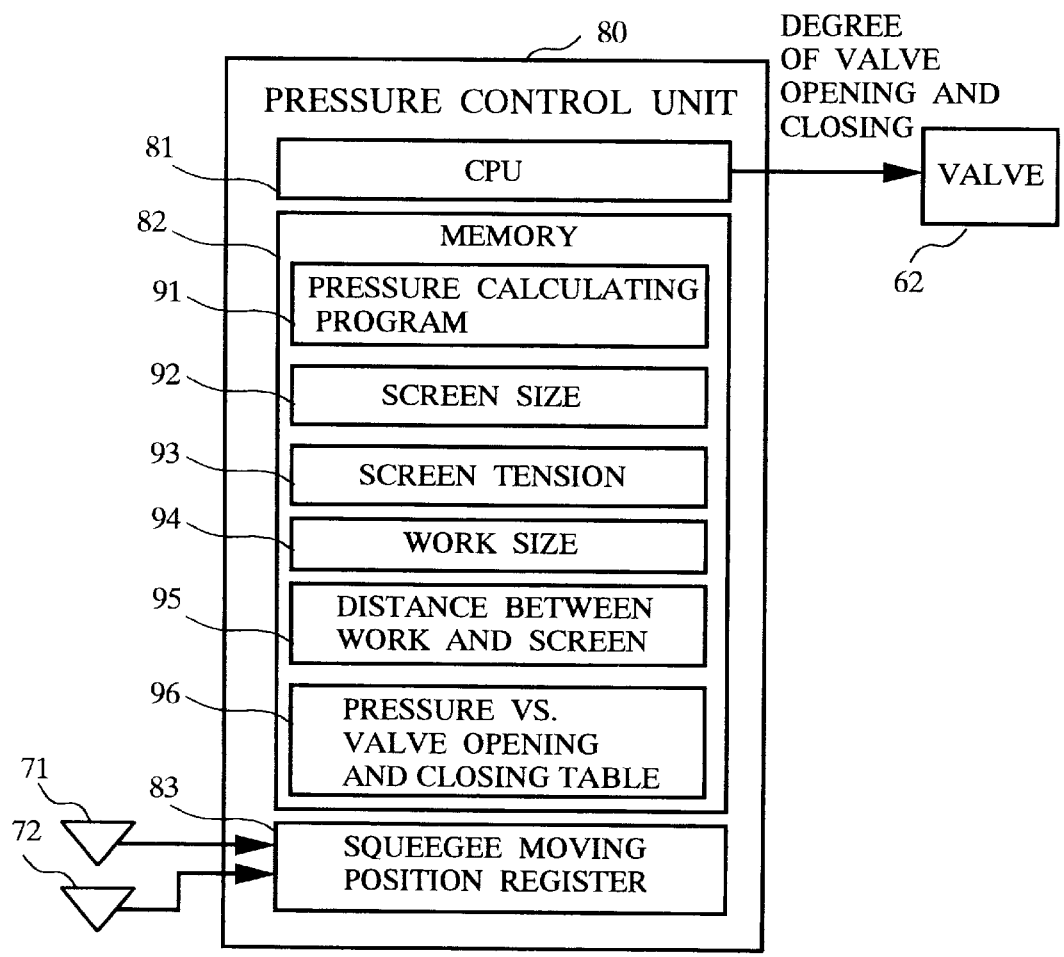
FIG. 5 illustrates another example of the pressure control unit 80 of the present invention.

FIG. 5 illustrates another example of the pressure control unit 80.

The following components are installed to the pressure control unit 80: a CPU (central processing unit) 81; a memory 82; and a squeegee moving position register 83. The memory 82 stores the following elements: a pressure calculating program 91; a screen size 92; a screen tension 93; a work size 94; a distance 95 between work and screen; and a pressure vs. valve opening and closing table 96. The CPU 81 and the pressure calculating program 91 calculate the degree of valve opening and closing using the values stored in the memory 82. The pressure P must be amended based on the screen size 92 and the screen tension 93. The pressure P must also be amended based on the work size 94 and the distance 95 between work and screen. The pressure P must further be a mended based on the squeegee moving position 83 reported by the sensors 71 and 72. The CPU 81 and the pressure calculating program 91 calculate a pressure based on these values, and retrieves the degree of valve opening and closing which corresponds to the calculated pressure by using the pressure vs. valve opening and closing table 96, and outputs the degree of valve opening and closing to the valve 62. The valve 62 is opened and closed based on the degree of valve opening and closing, and as a result of this, the pressure P is adjusted dynamically.

Figure 6:
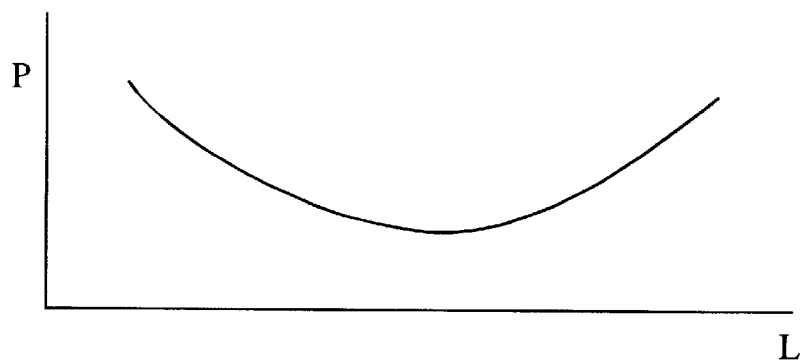
FIG. 6 illustrates another graph of the pressure P for the present invention.
Figure 7:
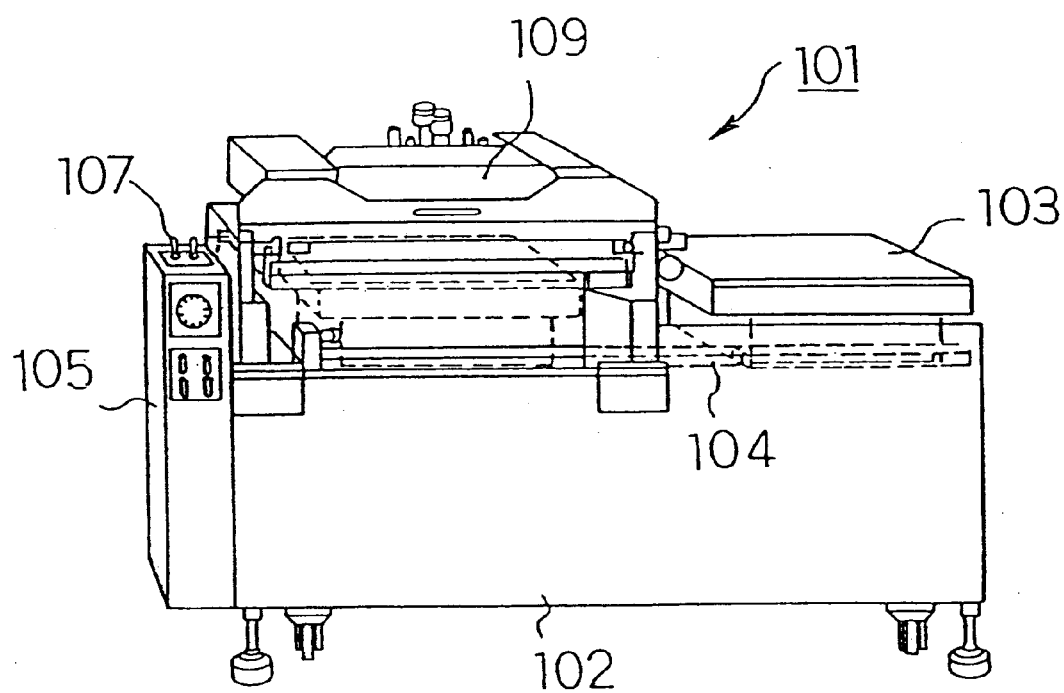
FIG. 7 illustrates a perspective side view of the conventional screen printer.
Figure 8:
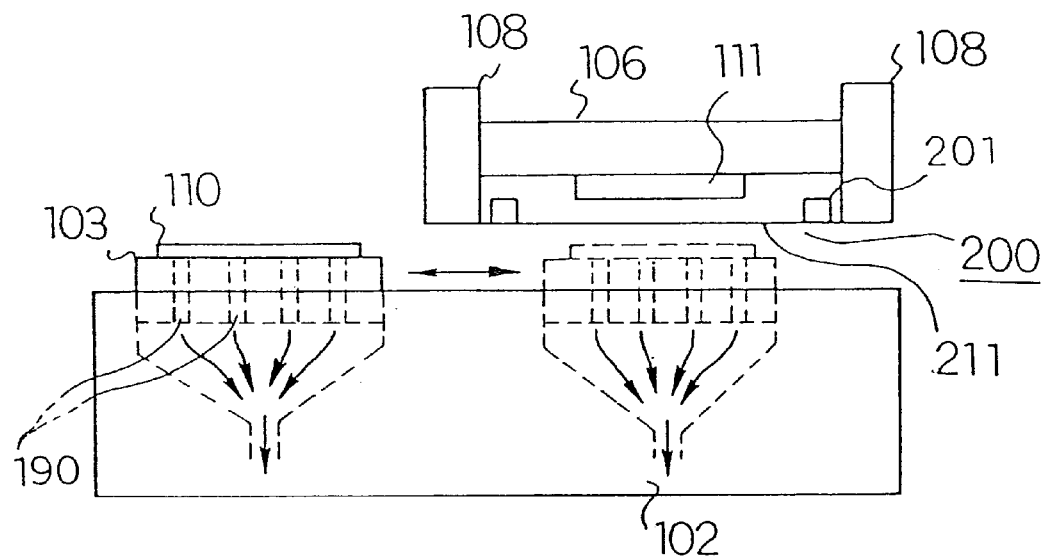
FIG. 8 illustrates a lateral view of the screen printer.
Figure 9:
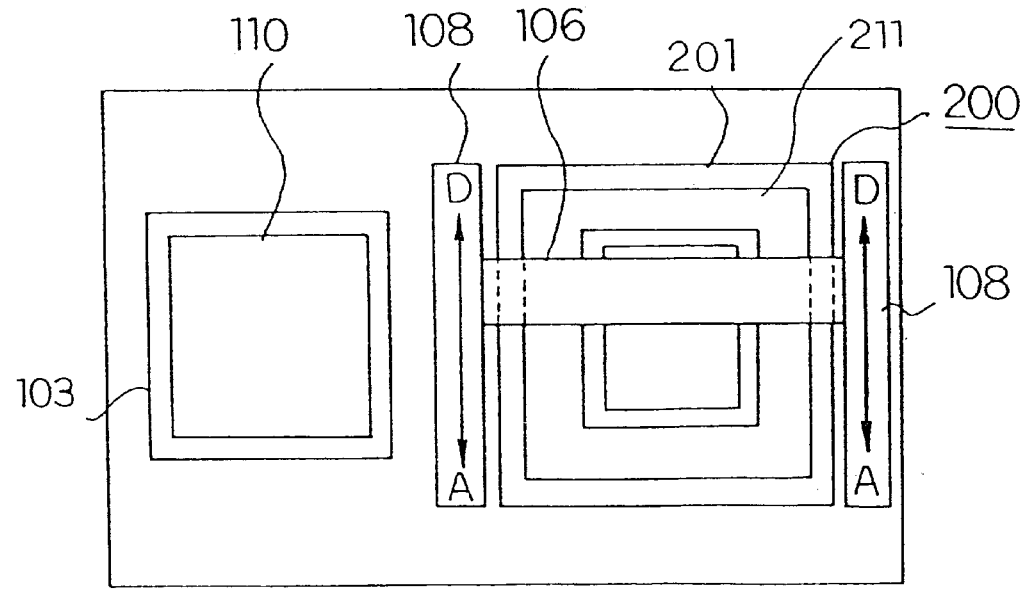
FIG. 9 illustrates a plane view of the screen printer.
Figure 10:
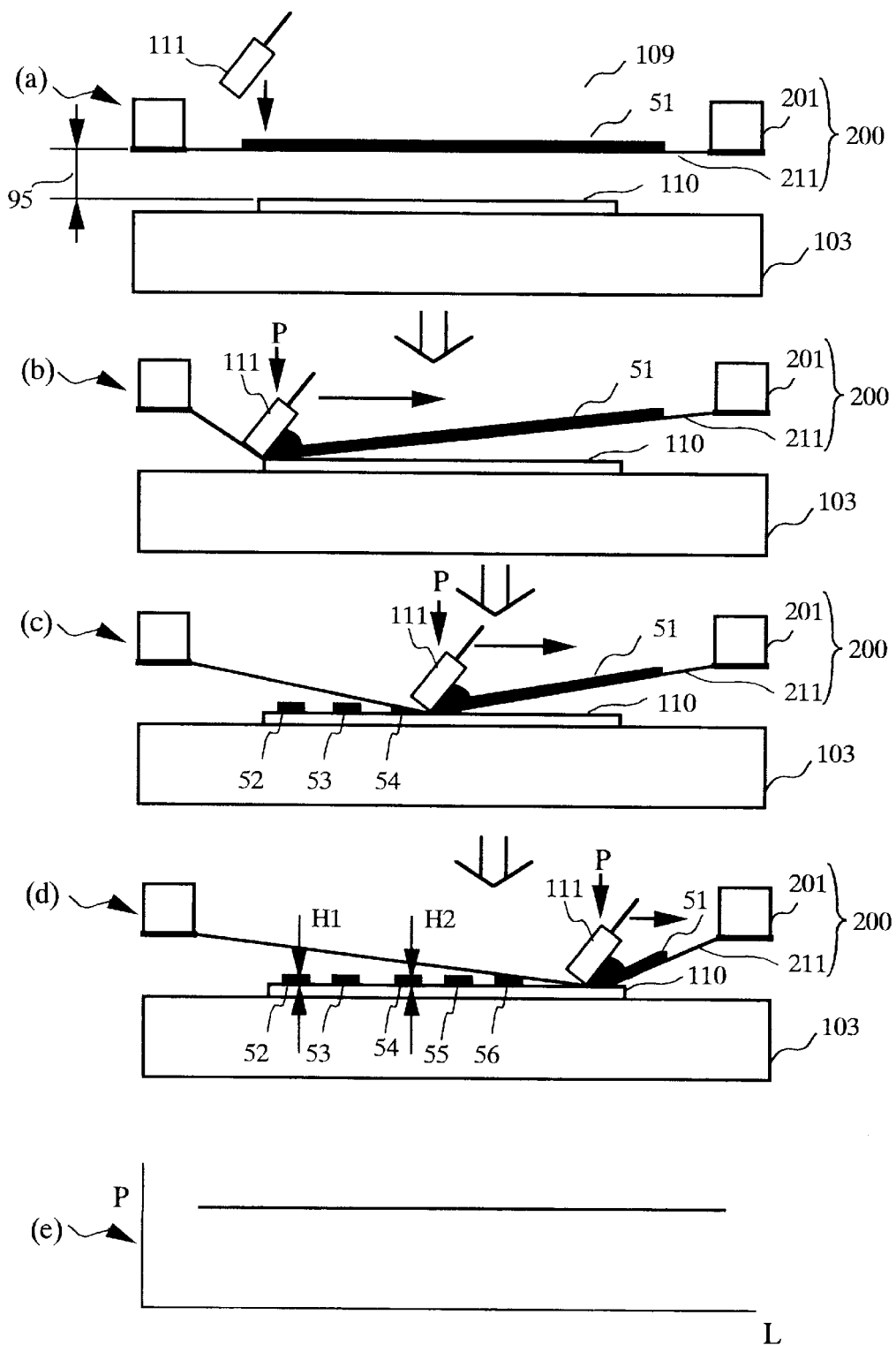
FIG. 10 illustrates a problem with the conventional screen printer.
Figure 11:
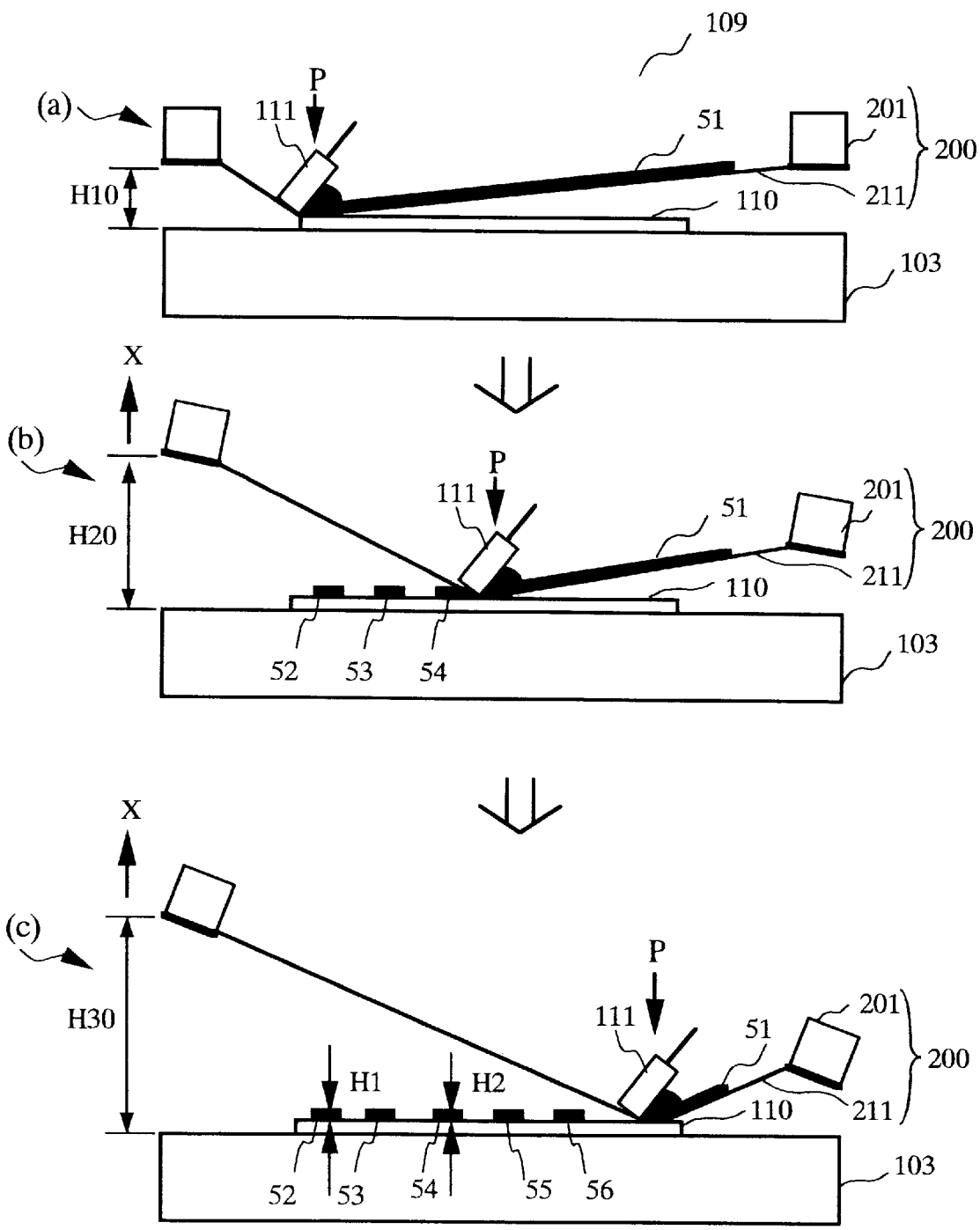
FIG. 11 illustrates a problem with the conventional screen printer.

The previously described sensors 71 and 72 detect the squeegee moving position, however, the squeegee moving position can alternatively be detected by a sensor based on a number of motor rotations involved in moving the slider 106. In detecting the squeegee moving position by counting the number of motor rotations, since the squeegee moving position changes momentarily, the graph of pressure P can be a smooth curve as illustrated in FIG. 6, and further, a constant and even printing becomes possible this way.

The pressure unit illustrated in FIG. 1 uses the air pump 61, the valve 62, and the air cylinder 63, however, a spring or a motor can be used instead, for a use in the pressure unit, without using the compressed air. For example, the pressure can be generated using the servo motor, a ball screw and a nut, instead of using the compressed air. A screw axis of the ball screw is directly connected to a rotation axis of the servo motor. The nut is engaged to the ball screw so that a straight back and forth motion of the nut is created by the rotation of the ball screw. The nut is fixed to the squeegee. The squeegee is held with the cylinder in such a way as to allow for the back and forth motion of the squeegee. When the nut moves back and forth by the rotation of the servo motor, the squeegee moves back and forth. As a result, the motor controls the pressure P.

Accordingly, the pressure unit can be of any type as long as it can control the pressure P.

As described previously, according to the present invention, it is possible to achieve the screen printer that does not result in uneven printing.

According to the present invention, since the lifting apparatus is not used, there is no need to apply unnecessary force to the screen, and the printing position is not displaced nor the durability of screen plate be reduced.

According to the present invention, a position detecting unit can change its setting position, therefore, an ideal pressure P is adjusted even if size or tension of the screen plate is changed, or even if the work size or the distance between work and screen is changed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A screen printing method for screen printer using a squeegee:

detecting a squeegee moving position during the screen printing with a detecting unit that includes two sensors capable of changing their setting positions along a direction of the squeegee movement;

applying a pressure to the squeegee during the screen printing; and controlling the pressure depending on the squeegee moving position detected;

wherein controlling the pressure includes:
maintaining the pressure at a constant pressure when the squeegee moving position is located between the two sensors; and increasing the pressure to a value grater than the constant pressure when the squeegee moving position is moving in a direction away from the two sensors and when the moving position is located outside of the position of the sensors.

2. A screen printer for screen printing using a squeegee, comprising:

a position detecting unit for detecting a squeegee moving position during the screen printing;

a pressure unit for applying a pressure to the squeegee during the screen printing; and a pressure control unit for controlling the pressure of the pressure unit depending on the squeegee moving position detected by the position detecting unit, wherein the position detecting unit includes two sensors spaced apart in a linear direction, which can change their setting positions along a direction of the squeegee movement, so that the pressure control unit fixes the pressure to be a constant pressure when the squeegee moving position is between the two sensors, and increases the pressure to a value greater than the constant pressure when the squeegee moving position is moving in a direction away from the two sensors and when the squeegee moving position is located outside of the position of the two sensors.

3. The screen printer according to claim 2, wherein the pressure unit includes an air pump for generating a compressed air; a valve for allowing a passage of the compressed air; and an air cylinder for applying the pressure to the squeegee by inputting the compressed air through the valve, wherein the pressure control unit adjusts a degree of opening and closing of the valve.

4. The screen printer according to claim 2, wherein the pressure unit includes a motor which generates the pressure.

5. The screen printer according to claim 4, wherein the position detecting unit includes a sensor which detects a number of motor rotations involved in the squeegee movement.

6. The screen printer according to claim 2, wherein the pressure control unit include a program which calculates the pressure based on the squeegee moving position and one of a screen size, a screen tension, a work size, and a distance between work and screen.

7. The screen printer according to claim 2, wherein the pressure control unit includes a CPU and a memory, wherein the memory stores a pressure calculating program, a screen size, a screen tension, a work piece size, and a distance between work piece and screen, wherein the CPU and the pressure calculating program calculate the pressure based on the screen size, the screen tension, the work piece size, the distance between the work piece and the screen, and the squeegee moving position detected by the two sensors.

* * * * *